United States Patent
Chen

(10) Patent No.: US 9,191,004 B2
(45) Date of Patent: Nov. 17, 2015

(54) SIGNAL CONVERTING DEVICE AND DIGITAL TRANSMITTING APPARATUS APPLYING THE SIGNAL CONVERTING DEVICE

(71) Applicant: MEDIATEK INC., Hsin-Chu (TW)

(72) Inventor: Yang-Chuan Chen, Chiayi County (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/271,470

(22) Filed: May 7, 2014

(65) Prior Publication Data

US 2014/0348259 A1 Nov. 27, 2014

Related U.S. Application Data

(60) Provisional application No. 61/825,630, filed on May 21, 2013.

(51) Int. Cl.
| | |
|---|---|
| *H04L 27/00* | (2006.01) |
| *H03K 19/0175* | (2006.01) |
| *H03F 3/217* | (2006.01) |
| *H04L 27/34* | (2006.01) |
| *H04B 1/04* | (2006.01) |
| *H04W 24/02* | (2009.01) |
| *H04L 25/02* | (2006.01) |
| *H04L 25/08* | (2006.01) |
| *H03M 1/12* | (2006.01) |
| *H04L 7/00* | (2006.01) |
| *G01R 21/06* | (2006.01) |
| *G01R 23/00* | (2006.01) |
| *H03F 1/24* | (2006.01) |
| *H04L 27/20* | (2006.01) |

(52) U.S. Cl.
CPC ........ *H03K 19/017509* (2013.01); *G01R 21/06* (2013.01); *G01R 23/00* (2013.01); *H03F 1/24* (2013.01); *H03F 3/2178* (2013.01); *H03K 19/017581* (2013.01); *H03M 1/12* (2013.01); *H04B 1/04* (2013.01); *H04B 1/0475* (2013.01); *H04L 7/0037* (2013.01); *H04L 7/0091* (2013.01); *H04L 25/028* (2013.01); *H04L 25/08* (2013.01); *H04L 27/2053* (2013.01); *H04L 27/2067* (2013.01); *H04L 27/3411* (2013.01); *H04L 27/3444* (2013.01); *H04W 24/02* (2013.01); *H03F 2203/21154* (2013.01); *H04B 2001/045* (2013.01); *H04B 2001/0408* (2013.01)

(58) Field of Classification Search
CPC ... H04L 1/0003; H04L 1/0071; H04L 5/0007; H04L 27/2647; H04L 25/028; H04L 25/08; H04L 7/0037; H04L 7/0091; H04L 27/3444; H04L 27/2053; H04L 27/2067; H04L 27/3411; H03F 2203/21154; H03F 3/2178; H03F 1/24; H04B 2001/045; H04B 2001/0408; H04B 1/04; H04B 1/0457; H04W 24/02

See application file for complete search history.

(56) References Cited

U.S. PATENT DOCUMENTS

2007/0278988 A1* 12/2007 De et al. .......................... 318/801
2014/0300206 A1* 10/2014 Moes et al. ................... 307/104

* cited by examiner

*Primary Examiner* — Ted Wang
(74) *Attorney, Agent, or Firm* — Winston Hsu; Scott Margo

(57) ABSTRACT

A signal converting device includes: a first converting circuit arranged to receive a first inputting signal; and a first capacitive circuit coupled between an output terminal of the first converting circuit and a reference voltage; wherein the first converting circuit is arranged to generate a first converting signal on the output terminal of the first converting circuit according to the first inputting signal.

18 Claims, 5 Drawing Sheets

US 9,191,004 B2

SIGNAL CONVERTING DEVICE AND DIGITAL TRANSMITTING APPARATUS APPLYING THE SIGNAL CONVERTING DEVICE

CROSS REFERENCE TO RELATED APPLICATIONS

This application claims the benefit of U.S. Provisional Application No. 61/825,630, which was filed on 2013 May 21 and is included herein by reference.

BACKGROUND

The present invention relates to a signal converting device and a digital transmitting apparatus, and more particularly to a digital transmitting apparatus having large dynamic power range.

In wireless communication system, such as the third generation (3G) mobile communication system, a high dynamic range of power is required. For example, a cellular may be required to output power with dynamic range of 78 dB. Normally, an on-chip transmitter capable of generating power range from 0 dBm to −78 dBm may comprise various components, such as digital-to-analog converter (DAC), low pass filter, programmable gain amplifier, modulator, and pre-driver, and those components are complicated and may occupy a large area of the transmitter. Therefore, replacing the transmitter by an RF power DAC, such as a digital transmitter using switch-mode power amplifier, may relax the hardware complexity. However, the dynamic range of the digital transmitter is limited by the minimum size of the semiconductor process. For example, the lowest power generated by one switch-mode power amplifier with the minimum size may only be −45 dBm, which is far higher than the required −78 dBm. Therefore, how to generate a small level of power by a switch-mode power amplifier to extend the dynamic range of a digital transmitter is an urgent problem in the wireless communication system.

SUMMARY

One objective of the present embodiment is to provide a digital transmitting apparatus having large dynamic power range.

According to a first embodiment of the present invention, a signal converting device is disclosed. The signal converting device comprises a first converting circuit and a first capacitive circuit. The first converting circuit is arranged to receive a first inputting signal. The first capacitive circuit is coupled between an output terminal of the first converting circuit and a reference voltage, wherein the first converting circuit is arranged to generate a first converting signal on the output terminal of the first converting circuit according to the first inputting signal.

According to a second embodiment of the present invention, a digital transmitting apparatus is disclosed. The digital transmitting apparatus comprises a plurality of more significant signal converting devices, a plurality of less significant signal converting devices, and a loading circuit. The plurality of more significant signal converting devices are arranged to generate a plurality of more significant output signals according to a plurality of more significant inputting signals respectively. The plurality of less significant signal converting devices are arranged to generate a plurality of less significant output signals according to a plurality of less significant inputting signals respectively. At least one of the plurality of less significant signal converting devices comprises a first converting circuit and a first capacitive circuit. The first converting circuit is arranged to receive a first less significant inputting signal. The first capacitive circuit is coupled between an output terminal of the first converting circuit and a reference voltage, wherein the first converting circuit is arranged to generate a first less significant converting signal on the output terminal of the first converting circuit according to the first less significant inputting signal, and the first capacitive circuit is arranged to generate a first less significant output signal according to the first less significant converting signal. The loading circuit is arranged to generate an amplified output signal according to the plurality of more significant output signals and the plurality of less significant output signals.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
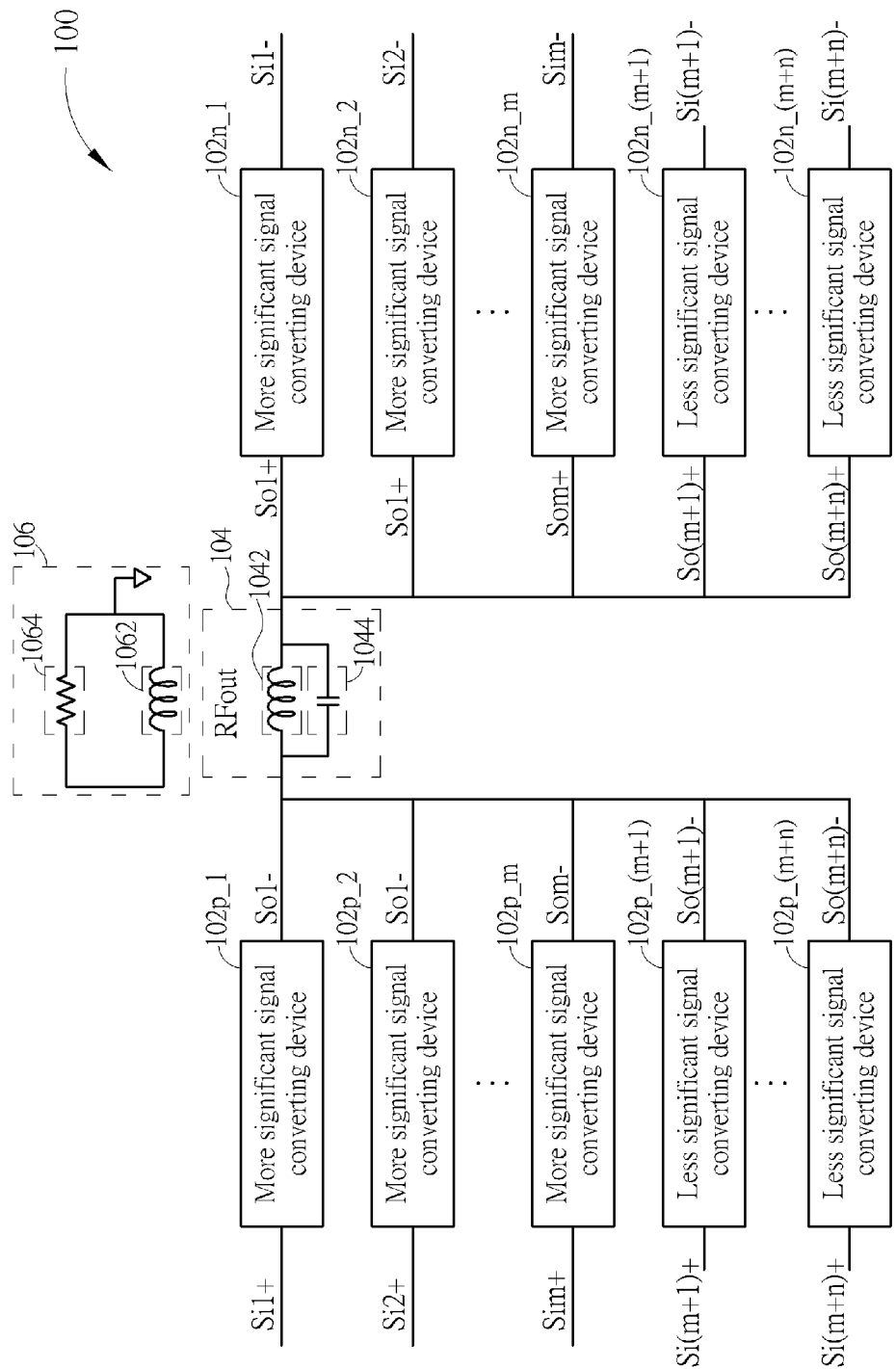
FIG. 1 is a diagram illustrating a digital transmitting apparatus according to an embodiment of the present invention.

Please refer to FIG. 1, which is a diagram illustrating a digital transmitting apparatus 100 according to an embodiment of the present invention. The digital transmitting apparatus 100 is a differential apparatus. The digital transmitting apparatus 100 is arranged to directly up-convert/amplify a plurality of differential inputting signals (Si1+, Si1−), (Si2+, Si2−), . . . , (Sim+, Sim−), (Si(m+1)+, Si(m+1)−), . . . , (Si(m+n)+, Si(m+n)−) into an RF signal (i.e. the amplified output signal RFout in below paragraph). The plurality of differential inputting signals (Si1+, Si1−), (Si2+, Si2−), . . . , (Sim+, Sim−), (Si(m+1)+, Si(m+1)−), . . . , (Si(m+n)+, Si(m+n)−) may be a plurality of differential digital signals or a plurality of differential square wave signals. The plurality of differential inputting signals (Si1+, Si1−), (Si2+, Si2−), ..., (Sim+, Sim−) correspond to the more significant differential bits of a digital signal whereas the plurality of differential inputting signals (Si(m+1)+, Si(m+1)−), ..., (Si(m+n)+, Si(m+n)−) correspond to the less significant differential bits of the digital signal. The digital transmitting apparatus 100 comprises a plurality of differential more significant signal converting devices 102p_1, 102n_1, 102p_2, 102n_2, ..., 102p_m, 102n_m, a plurality of differential less significant signal converting devices 102p_(m+1), 102n (m+1), 102p (m+2), 102n_(m+2), ..., 102p_(m+n), 102n (m+n), a loading circuit 104, and a coupling circuit 106.

The plurality of differential more significant signal converting devices 102p_1, 102n_1, 102p_2, 102n_2, ..., 102p_m, 102n_m are arranged to generate a plurality of more significant output signals (So1−, So1+), (So2−, So2+), ..., (Som−, Som+) according to the more significant differential inputting signals (Si1+, Si1−), (Si2+, Si2−), ..., (Sim+, Sim−) respectively. The plurality of differential less significant signal converting devices 102p_(m+1), 102n_(m+1), 102p_(m+2), 102n_(m+2), ..., 102p_(m+n), 102n_(m+n) are arranged to generate a plurality of less significant output signals (So(m+1)−, So(m+1)+), (So(m+2)−, So(m+2)+), ..., (So(m+n)−, So(m+n)+) according to the less significant differential inputting signals (Si(m+1)+, Si(m+1)−), ..., (Si(m+n)+, Si(m+n)−) respectively. In this embodiment, the plurality of differential more significant signal converting devices 102p_1, 102n_1, 102p_2, 102n_2, ..., 102p_m, 102n_m are configured to have a configuration, and the plurality of differential less significant signal converting devices 102p_(m+1), 102n_(m+1), 102p_(m+2), 102n_(m+2), ..., 102p_(m+n), 102n_(m+n) are configured to have another configuration.

The loading circuit 104 is arranged to generate the amplified output signal RFout according to the plurality of more significant output signals (So1−, So1+), (So2−, So2+), ..., (Som−, Som+) and the plurality of less significant output signals (So(m+1)−, So(m+1)+), (So(m+2)−, So(m+2)+), ..., (So(m+n)−, So(m+n)+). The coupling circuit 106 is arranged to couple the amplified output signal RFout for transmission. It is noted that the loading circuit 104 and the coupling circuit 106 are configured to be a transformer.

It is noted that, in this embodiment, the differential inputting signals (Si1+, Si1−) corresponds to the most significant bit of the digital input data of the digital transmitting apparatus 100, and the differential inputting signals (Si(m+n)+, Si(m+n)−) corresponds to the least significant bit of the digital input data of the digital transmitting apparatus 100. Therefore, the significances of the differential inputting signals between the differential inputting signals (Si1+, Si1−) and the differential inputting signals (Si(m+n)+, Si(m+n)−) are orderly decreased from the differential inputting signals (Si2+, Si2−) to the differential inputting signals (Si(m+(n−11))+, Si(m+(n−1))−).

Therefore, the power levels of the plurality of less significant output signals (So(m+1)−, So(m+1)+), (So(m+2)−, So(m+2)+), ..., (So(m+n)−, So(m+n)+) generated by the plurality of differential less significant signal converting devices 102p_(m+1), 102n_(m+1), 102p_(m+2), 102n_(m+2), ..., 102p_(m+n), 102n_(m+n), respectively, are lower than a specific power level. In this embodiment, the specific power level is the power level corresponding to the differential more significant signal converting devices 102p_m, 102n_m that receive the more significant differential inputting signals (Sim+, Sim−). The differential inputting signals (Sim+, Sim−) is the least significant signals among the plurality of differential inputting signals (Si1+, Si1−), (Si2+, Si2−), ..., (Sim+, Sim−).

Figure 2:
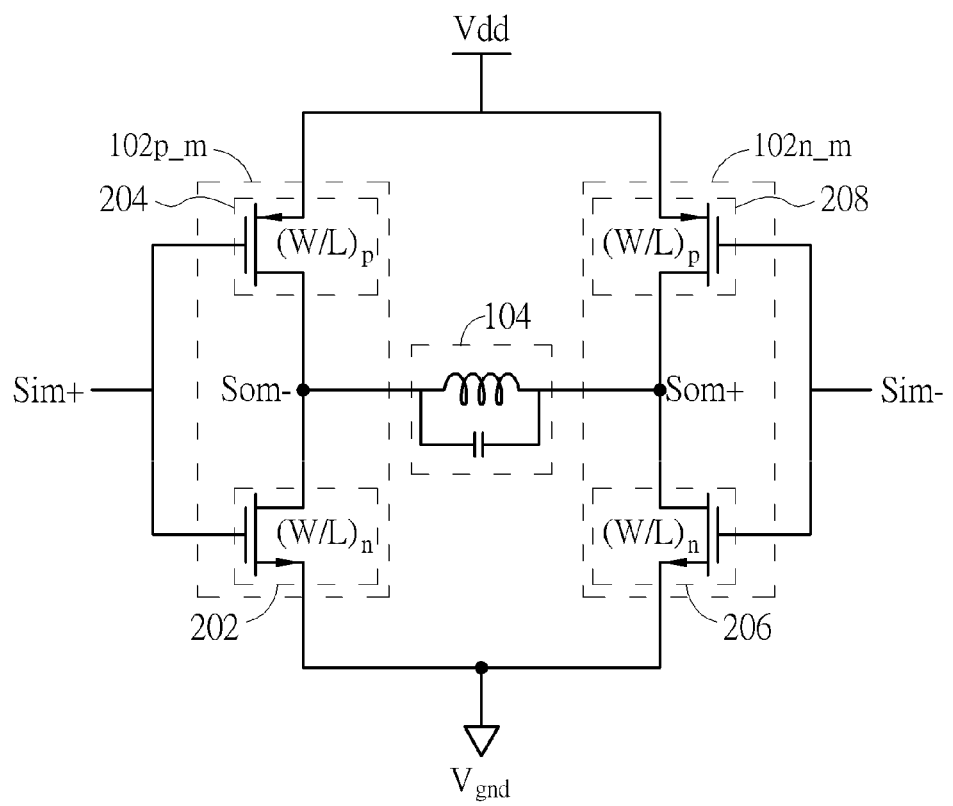
FIG. 2 is a diagram illustrating the configuration of a differential more significant signal converting devices according to an embodiment of the present invention.

FIG. 2 is a diagram illustrating the configuration of the differential more significant signal converting devices 102p_m, 102n_m according to an embodiment of the present invention. For illustrative purposes, the loading circuit 104 is also shown in FIG. 2. It is noted that the other differential more significant signal converting devices 102p_1, 102n_1, 102p_2, 102n_2, ..., 102p_(m−1), 102n_(m−1) also have the similar configuration. The signal converting device 102p_m comprises an N-type field-effected transistor (FET) 202 and a P-type FET 204, in which the N-type FET 202 and the P-type FET 204 are configured to be an inverter. The signal converting device 102n_m comprises an N-type field-effected transistor (FET) 206 and a P-type FET 208, in which the N-type FET 206 and the P-type FET 208 are configured to be an inverter. The aspect ratios of the N-type FET 202 and 206 are $(W/L)_n$, which is the smallest size of the semiconductor process that manufactures the N-type FET in the digital transmitting apparatus 100. The aspect ratios of the P-type FET 204 and 208 are $(W/L)_p$, which is the smallest size of the semiconductor process that manufactures P-type FET in the digital transmitting apparatus 100.

Figure 3:
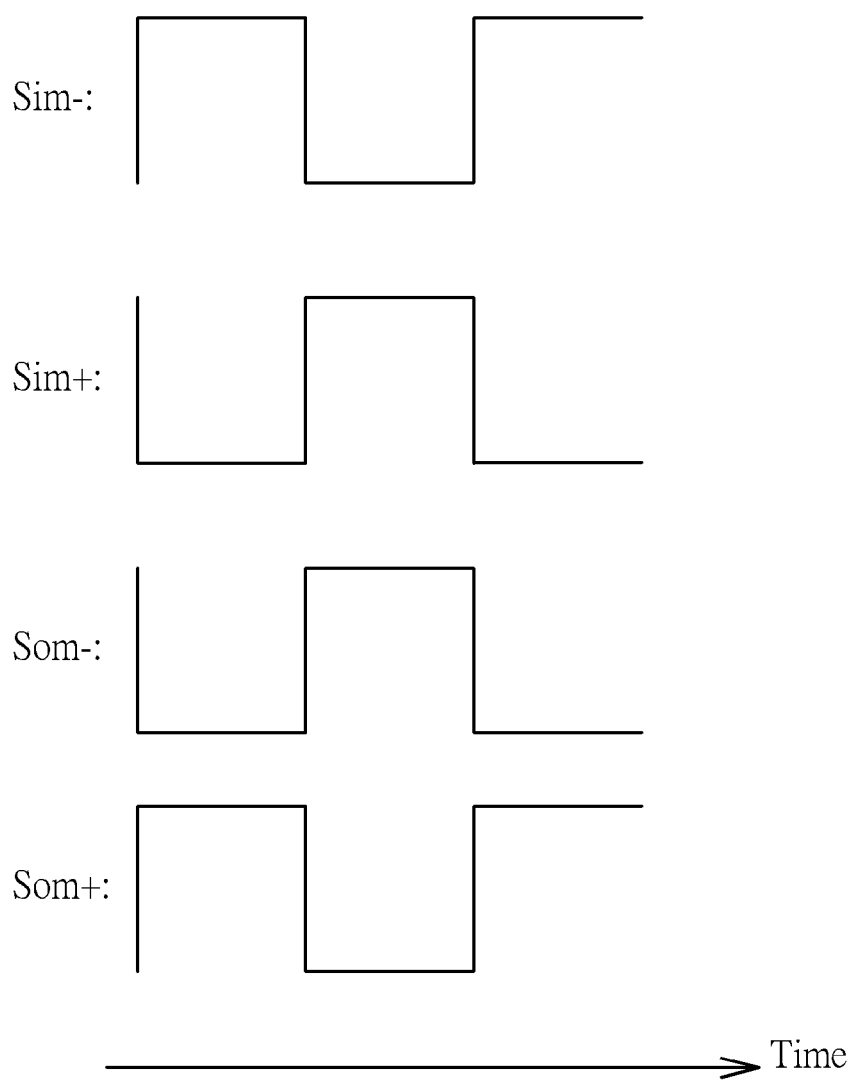
FIG. 3 is a timing diagram illustrating a differential inputting signals and a differential output signals of a differential more significant signal converting devices according to an embodiment of the present invention.

According to FIG. 2, the signal converting device 102p_m is arranged to invert the inputting signal Sim+ to generate the output signal Som−, and the signal converting device 102n_m is arranged to invert the inputting signal Sim− to generate the output signal Som+ as shown in FIG. 3, which is the timing diagram illustrating the inputting signal Sim+, the inputting signal Sim−, the output signal Som+, and the output signal Som− of the differential more significant signal converting devices 102p_m, 102n_m according to an embodiment of the present invention. It can be seen that the inputting signal Sim+, the inputting signal Sim−, the output signal Som+, and the output signal Som− are square wave signals when the aspect ratios (i.e. $(W/L)_n$) of the N-type FET 202 and 206 and the aspect ratios (i.e. $(W/L)_p$) of the P-type FET 204 and 208 are the smallest size of the semiconductor process. In other words, by using the configuration as shown in FIG. 2, the power level of the differential more significant signal converting devices 102p_m, 102n_m is the lowest power level among the plurality of differential more significant signal converting devices 102p_1, 102n_1, 102p_2, 102n_2, ..., 102p_m, 102n_m because the aspect ratios (i.e. $(W/L)_n$) of the N-type FET 202 and 206 and the aspect ratios (i.e. $(W/L)_p$) of the P-type FET 204 and 208 are the smallest aspect ratio. For example, the power level of the differential more significant signal converting devices 102p_m, 102n_m is substantially −45 dBm.

Accordingly, to extend the dynamic range of the digital transmitting apparatus 100 to lower than the power level of the differential more significant signal converting devices 102p_m, 102n_m, the plurality of differential less significant signal converting devices 102p_(m+1), 102n_(m+1), 102p_(m+2), 102n_(m+2), ..., 102p_(m+n), 102n_(m+n) are presented. In this embodiment, the power levels of the plurality of differential less significant signal converting devices 102p_(m+1), 102n_(m+1), 102p_(m+2), 102n_(m+2), ..., 102p_(m+n), 102n_(m+n) are smaller than the power level of the differential more significant signal converting devices 102p_m, 102n_m, and the power levels of the plurality of differential less significant signal converting devices 102p_(m+1), 102n_(m+1), 102p_(m+2), 102n_(m+2), ..., 102p_(m+n), 102n_(m+n) decrease in orderly. In other words, the differential less significant signal converting devices 102p_(m+n), 102n_(m+n) have the smallest power level. For example, the power level of the differential less significant signal converting devices 102p (m+n), 102n (m+n) may reach −78 dBm.

Figure 4:
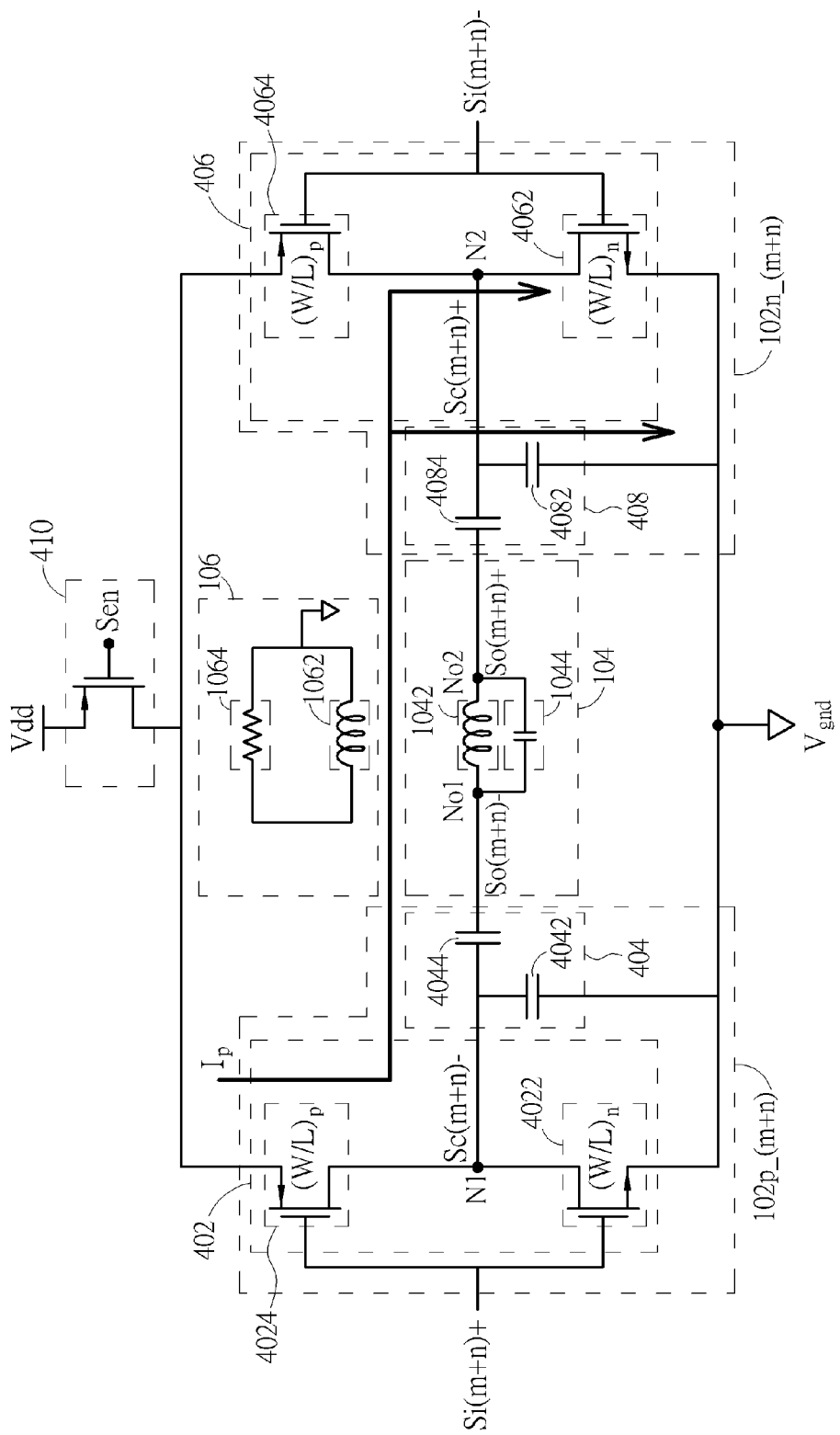
FIG. 4 is a diagram illustrating one of the plurality of differential less significant signal converting devices according to an embodiment of the present invention.

Please refer to FIG. 4, which is a diagram illustrating one (e.g. the differential less significant signal converting devices 102p_(m+n), 102n_(m+n)) of the plurality of differential less significant signal converting devices 102p_(m+1), 102n_(m+1), 102p_(m+2), 102n_(m+2), . . . , 102p_(m+n), 102n_(m+n) according to an embodiment of the present invention. For illustrative purposes, the loading circuit 104 and the coupling circuit 106 are also shown in FIG. 4. The signal converting device 102p_(m+n) comprises a first converting circuit 402 and a first capacitive circuit 404. The first converting circuit 402 is arranged to receive the inputting signal Si(m+n)+. The first capacitive circuit 404 is coupled between an output terminal N1 of the first converting circuit 402 and a reference voltage, e.g. the ground voltage Vgnd. The first converting circuit 402 is arranged to generate a first converting signal Sc(m+n)− on the output terminal N1 according to the inputting signal Si(m+n)+. On the other hand, the signal converting device 102n_(m+n) comprises a second converting circuit 406 and a second capacitive circuit 408. The second converting circuit 406 is arranged to receive the inputting signal Si (m+n)−. The second capacitive circuit 408 is coupled between an output terminal N2 of the second converting circuit 406 and the ground voltage Vgnd. The second converting circuit 406 is arranged to generate a second converting signal Sc(m+n)+ on the output terminal N2 according to the inputting signal Si(m+n)−.

The loading circuit 104 is an inductive circuit coupled between the first capacitive circuit 404 and the second capacitive circuit 408 for generating the less significant output signals (So(m+n)−, So(m+n)+) according to the first converting signal Sc(m+n)− and the second converting signal Sc(m+n)+.

The first capacitive circuit 404 comprises a first capacitor 4042 and a second capacitor 4044. The first capacitor 4042 has a first terminal coupled to the output terminal N1 of the first converting circuit 402 and a second terminal coupled to the ground voltage Vgnd. The second capacitor 4044 has a first terminal coupled to the output terminal N1 of the first converting circuit 402 and a second terminal No2 coupled to the loading circuit 104. The second capacitive circuit 408 comprises a third capacitor 4082 and a fourth capacitor 4084. The third capacitor 4082 has a first terminal coupled to the output terminal N2 of the second converting circuit 406 and a second terminal coupled to the ground voltage Vgnd. The fourth capacitor 4084 has a first terminal coupled to the output terminal N2 of the second converting circuit 406 and a second terminal No2 coupled to the loading circuit 104.

The loading circuit 104 comprises an inductor 1042 and a fifth capacitor 1044. The inductor 1042 has a first terminal coupled to the second terminal No1 of the second capacitor 4044, and a second terminal coupled to the second terminal No2 of the fourth capacitor 4082. The fifth capacitor 1044 has a first terminal coupled to the second terminal No1 of the second capacitor 4044, and a second terminal coupled to the second terminal No2 of the fourth capacitor 4084.

The coupling circuit 106 comprises an inductor 1062 and a resistor 1064. The inductor 1062 is arranged to magnetically couple the amplified output signal RFout on the inductor 1042. The resistor 1064 having 50 Ohm is connected to the inductor 1062 in parallel.

The first converting circuit 402 comprises an N-type FET 4022 and a P-type FET 4024, in which the N-type FET 4022 and the P-type FET 4024 are configured to be an inverter. The first converting circuit 406 comprises an N-type FET 4062 and a P-type FET 4064, in which the N-type FET 4062 and the P-type FET 4064 are configured to be an inverter. The aspect ratios of the N-type FETs 4022 and 4062 are $(W/L)_n$, which is the smallest size of the semiconductor process that manufactures the N-type FET in the digital transmitting apparatus 100. The aspect ratios of the P-type FETs 4024 and 4064 are $(W/L)_p$, which is the smallest size of the semiconductor process that manufactures P-type FET in the digital transmitting apparatus 100.

In addition, a switching circuit 410 is also shown in FIG. 4. The switching circuit 410 is coupled between the supply voltage Vdd and the source terminals of the P-type FETs 4024 and 4064. The switching circuit 410 is a P-type FET having a gate terminal coupled to an enable signal Sen. When the enable signal Sen turns on the switching circuit 410, the differential less significant signal converting devices 102p_(m+n), 102n_(m+n) are enabled, and vice versa.

Figure 5:
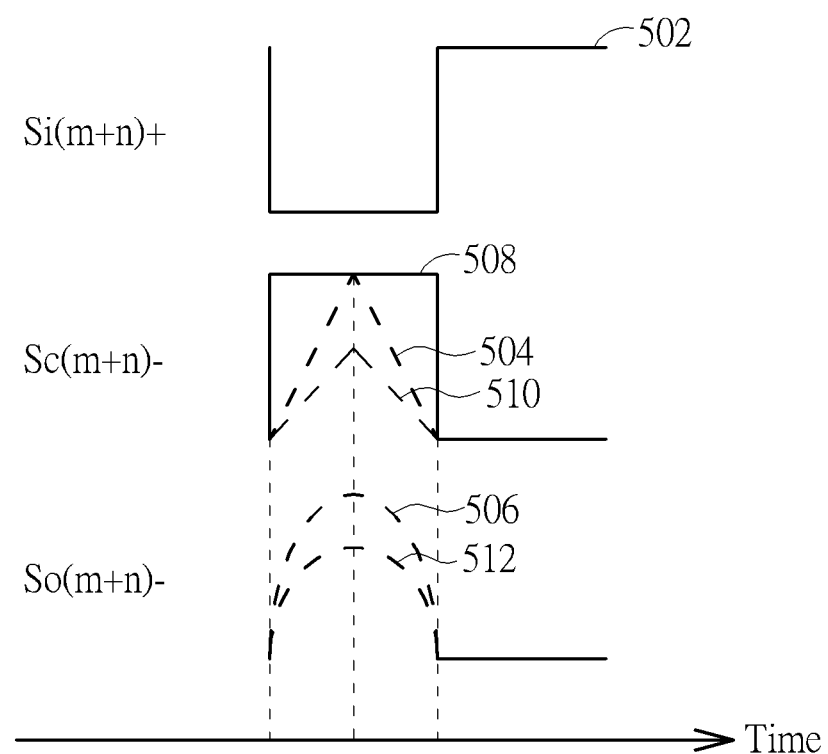
FIG. 5 is a timing diagram illustrating an inputting signal, a first converting signal, and an output signals according to an embodiment of the present invention.

According to the embodiment, when the P-type FET 4024 is turned on by the inputting signal Si(m+n)+, the N-type FET 4022 is turned off by the inputting signal Si(m+n)+. Meanwhile, the P-type FET 4064 is turned off and the N-type FET 4062 is turned on by the inputting signal Si(m+n)−. Therefore, the current Ip is flowed from the supply voltage Vdd to the ground voltage Vgnd via the switching circuit 410, the P-type FET 4024, the first capacitive circuit 404, the loading circuit 104, the second capacitive circuit 408, and the N-type FET 4062. The first capacitive circuit 404 is arranged to increase the rising time (i.e. to decrease the slope) of the first converting signal Sc(m+n)−, and the loading circuit 104 is arranged to act as a low-passed filter (i.e. LC filter) to low pass the output signals So(m+n)− as shown in FIG. 5. FIG. 5 is a timing diagram illustrating the inputting signal Si(m+n)+, the first converting signal Sc(m+n)−, and the output signals So(m+n)− according to an embodiment of the present invention. The inputting signal Si(m+n)+ is represent by the curve 502, the first converting signal Sc(m+n)− is represented by the curve 504, and the output signals So(m+n)− is represented by the curve 506. The curve 508 is the signal at the terminal N1 without the present first capacitive circuit 404, and the curve 508 is full swing square wave. It can be seen that, by using the present first capacitive circuit 404, the first converting signal Sc(m+n)− becomes a triangle wave instead of a square wave. Therefore, the power level of the first converting signal Sc(m+n)− is smaller than the power level (i.e. the curve 508) without using the present first capacitive circuit 404. Then, the loading circuit 104 low passes the first converting signal Sc (m+n)− to remove the high ordered harmonic terms in the first converting signal Sc(m+n)− for generating the output signals So(m+n)−. Accordingly, the power level of the output signals So(m+n)− is extended to the smaller level in comparison to the counterparts without using the first capacitive circuit 404.

In addition, the capacitances of the first capacitor 4042 and the second capacitor 4044 are adjustable. By varying the ratio between the capacitances of the first capacitor 4042 and the second capacitor 4044, the power level of the first converting signal Sc(m+n)− (and so do the output signals So(m+n)−) can be adjusted. For example, if the capacitance of the first capacitor 4042 is increased, the first converting signal Sc(m+n)− may become the curve of 510 and the output signals So(m+n)− may become the curve 512. Then, the power levels of the curves 510 and 512 can be reduced to more smaller than the power levels of the curves 504 and 506 respectively. Therefore, by adjusting the ratio between the capacitances of the first capacitor 4042 and the second capacitor 4044, the power level of the output signals So(m+n)− can be well-defined.

It is noted that, although only the converting device $102p\_(m+n)$ is described in the above paragraphs, the converting device $102n\_(m+n)$ also has the similar characteristic because the converting device $102p\_(m+n)$ and the converting device $102n\_(m+n)$ are configured to be a differential pair circuit.

Therefore, the first capacitive circuit 404 and the second capacitive circuit 408 are arranged to make the differential converting signals $Sc(m+n)-$, $Sc(m+n)+$ to be the triangle waves instead of the digital full swing square waves, such that the power level of the differential output signals $So(m+n)-$, $So(m+n)+$ generated by the differential less significant signal converting devices $102p\_(m+n)$, $102n\_(m+n)$ is adjustable to become lower than the specific power level of the differential output signals $Som-$, $Som+$ generated by the differential more significant signal converting devices $102p\_m$, $102n\_m$.

According to the embodiment as shown in FIG. 1, by well defining the first capacitive circuits and the second capacitive circuits in the plurality of differential less significant signal converting devices $102p\_(m+1)$, $102n\_(m+1)$, $102p\_(m+2)$, $102n\_(m+2)$, ..., $102p\_{(m+n)}$, $102n\_(m+n)$ respectively, the power levels of the plurality of less significant output signals $(So(m+1)-, So(m+1)+)$, $(So(m+2)-, So(m+2)+)$, ..., $(So(m+n)-, So(m+n)+)$ generated by the plurality of differential less significant signal converting devices $102p\_(m+1)$, $102n\_(m+1)$, $102p\_(m+2)$, $102n\_(m+2)$, ..., $102p\_(m+n)$, $102n\_(m+n)$ decrease in orderly. In other words, the differential output signals $So(m+n)-$, $So(m+n)+$ generated by the differential less significant signal converting devices $102p\_(m+n)$, $102n\_(m+n)$ has the smallest power level. For example, the smallest power level may be around −78 dBm. Therefore, the digital transmitting apparatus 100 has a wide dynamic power range (e.g. from 0 dBm to −78 dBm) in comparison to the conventional counterpart. Moreover, by using the present capacitive circuit to decrease the power level of a less significant signal converting device, the power level of the output signal generated by the less significant signal converting device is also independent to the temperature variation.

It should be noted that, although the above embodiment is described in a way of differential pair, this is not the limitation of the present invention. The present ideas can also be applied in the single-ended digital transmitting apparatus. The detailed description is omitted here for brevity.

In addition, the first capacitive circuit 404 and the second capacitive circuit 408 are not limited to the configuration as shown in FIG. 4, any other circuit (e.g. capacitors and/or resistors) combinations having the similar characteristic are belong to the scope of the present invention.

Briefly, as illustrated in the above embodiments, the present invention breaks through the semiconductor process limitation to extend the dynamic range of a digital transmitter. The present invention applies the capacitive circuits to reduce the power level of the plurality of differential less significant signal converting devices for extending the dynamic range of the digital transmitter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal converting device, comprising:
   a first converting circuit, arranged to receive a first inputting signal;
   a first capacitive circuit, coupled between an output terminal of the first converting circuit and a reference voltage;
   a second converting circuit, arranged to receive a second inputting signal;
   a second capacitive circuit, coupled between an output terminal of the second converting circuit and the reference voltage; and
   an inductive circuit, coupled between the first capacitive circuit and the second capacitive circuit, for generating an output signal according to the first converting signal and the second converting signal, wherein the inductive circuit is a low-pass filter;
   wherein the first converting circuit is arranged to generate a first converting signal on the output terminal of the first converting circuit according to the first inputting signal; and the first converting circuit is an inverter;
   wherein the second signal converting circuit is arranged to generate a second converting signal on the output terminal of the second converting circuit according to the second inputting signal.

2. The signal converting device of claim 1, wherein the second converting circuit is an inverter.

3. The signal converting device of claim 1, wherein the first inputting signal and the second inputting signal are configured to be a differential signal.

4. The signal converting device of claim 1, wherein the first inputting signal and the second inputting signal are configured to be a differential square wave.

5. The signal converting device of claim 1, wherein the first capacitive circuit comprises:
   a first capacitor, having a first terminal coupled to the output terminal of the first converting circuit and a second terminal coupled to the reference voltage; and
   a second capacitor, having a first terminal coupled to the output terminal of the first converting circuit and a second terminal coupled to the inductive circuit; and
   the second capacitive circuit comprises:
   a third capacitor, having a first terminal coupled to the output terminal of the second converting circuit and a second terminal coupled to the reference voltage; and
   a fourth capacitor, having a first terminal coupled to the output terminal of the second converting circuit and a second terminal coupled to the inductive circuit.

6. The signal converting device of claim 5, wherein the inductive circuit comprises:
   an inductor, having a first terminal coupled to the second terminal of the second capacitor, and a second terminal coupled to the second terminal of the fourth capacitor; and
   a fifth capacitor, having a first terminal coupled to the second terminal of the second capacitor, and a second terminal coupled to the second terminal of the fourth capacitor.

7. The signal converting device of claim 5, wherein the first capacitor, the second capacitor, the third capacitor, and the fourth capacitor are adjustable capacitors.

8. A digital transmitting apparatus, comprising:
   a plurality of more significant signal converting devices, arranged to generate a plurality of more significant output signals according to a plurality of more significant inputting signals respectively;
   a plurality of less significant signal converting devices, arranged to generate a plurality of less significant output signals according to a plurality of less significant inputting signals respectively, and at least one of the plurality of less significant signal converting devices comprising:
   a first converting circuit, arranged to receive a first less significant inputting signal; and a first capacitive circuit, coupled between an output terminal of the first converting circuit and a reference voltage, wherein the first converting circuit is arranged to generate a first less significant converting signal on the output terminal of the first converting circuit according to the first less significant inputting signal, and the first capacitive circuit is arranged to generate a first less significant output signal according to the first less significant converting signal;

a loading circuit, arranged to generate an amplified output signal according to the plurality of more significant output signals and the plurality of less significant output signals.

9. The digital transmitting apparatus of claim 8, wherein the at least one of the plurality of less significant signal converting devices is an inverter.

10. The digital transmitting apparatus of claim 8, wherein the at least one of the plurality of less significant signal converting devices further comprises:
   a second converting circuit, arranged to receive a second less significant inputting signal; and
   a second capacitive circuit, coupled between an output terminal of the second converting circuit and the reference voltage;
wherein the second signal converting circuit is arranged to generate a second less significant converting signal on the output terminal of the second converting circuit according to the second less significant inputting signal, and the second capacitive circuit is arranged to generate a second less significant output signal according to the second less significant converting signal.

11. The digital transmitting apparatus of claim 10, wherein the second converting circuit is an inverter.

12. The digital transmitting apparatus of claim 10, wherein the first less significant inputting signal and the second less significant inputting signal are configured to be a differential signal.

13. The digital transmitting apparatus of claim 10, wherein the first less significant inputting signal and the second less significant inputting signal are configured to be a differential square wave.

14. The digital transmitting apparatus of claim 10, wherein the loading circuit is an inductive circuit coupled between the first capacitive circuit and the second capacitive circuit for receiving the first less significant output signal and the second less significant output signal.

15. The digital transmitting apparatus of claim 14, wherein the inductive circuit is a low-pass filter.

16. The digital transmitting apparatus of claim 14, wherein the first capacitive circuit comprises:
   a first capacitor, having a first terminal coupled to the output terminal of the first converting circuit and a second terminal coupled to the reference voltage; and
   a second capacitor, having a first terminal coupled to the output terminal of the first converting circuit and a second terminal coupled to the inductive circuit; and
the second capacitive circuit comprises:
   a third capacitor, having a first terminal coupled to the output terminal of the second converting circuit and a second terminal coupled to the reference voltage; and
   a fourth capacitor, having a first terminal coupled to the output terminal of the second converting circuit and a second terminal coupled to the inductive circuit.

17. The digital transmitting apparatus of claim 16, wherein the inductive circuit comprises:
   an inductor, having a first terminal coupled to the second terminal of the second capacitor, and a second terminal coupled to the second terminal of the fourth capacitor; and
   a fifth capacitor, having a first terminal coupled to the second terminal of the second capacitor, and a second terminal coupled to the second terminal of the fourth capacitor.

18. The digital transmitting apparatus of claim 16, wherein the first capacitor, the second capacitor, the third capacitor, and the fourth capacitor are adjustable capacitors.

* * * * *